US008713414B2

(12) United States Patent
Kamuf et al.

(10) Patent No.: US 8,713,414 B2
(45) Date of Patent: Apr. 29, 2014

(54) METHOD AND APPARATUS FOR SOFT INFORMATION TRANSFER BETWEEN CONSTITUENT PROCESSOR CIRCUITS IN A SOFT-VALUE PROCESSING APPARATUS

(75) Inventors: Matthias Kamuf, Waghäusel (DE); Andres Reial, Malmö (SE)

(73) Assignee: Telefonaktiebolager L M Ericsson (Publ), Stockholm (SE)

( * ) Notice: Subject to any disclaimer, the term of this patent is extended or adjusted under 35 U.S.C. 154(b) by 322 days.

(21) Appl. No.: 13/358,978

(22) Filed: Jan. 26, 2012

(65) Prior Publication Data

US 2013/0198591 A1    Aug. 1, 2013

(51) Int. Cl.
*H03M 13/03* (2006.01)
(52) U.S. Cl.
USPC ........................................................ 714/780
(58) Field of Classification Search
CPC ..... H04L 1/005; H04L 1/0068; H04L 1/0066; H04L 1/0003; H04L 1/0013; H04L 1/0041; H04L 5/143; H03M 13/2957; H03M 13/2963; H03M 13/45; H03M 13/6362
USPC ........... 714/780, 790, 795, 755; 375/262, 341
See application file for complete search history.

(56) References Cited

U.S. PATENT DOCUMENTS

| 5,539,749 | A  | * | 7/1996  | Eul             | 370/331 |
| 5,946,417 | A  | * | 8/1999  | Bonneau et al.  | 382/236 |
| 6,446,236 | B1 | * | 9/2002  | McEwen et al.   | 714/795 |
| 6,981,060 | B2 | * | 12/2005 | Malm            | 709/247 |
| 8,209,579 | B2 | * | 6/2012  | Belogolovy      | 714/752 |

FOREIGN PATENT DOCUMENTS

| EP | 1605624 A1    | 12/2005 |
| EP | 2328296 A1    | 6/2011  |
| EP | 2202894 B1    | 11/2011 |
| WO | 2005062494 A1 | 7/2005  |
| WO | 2010043556 A1 | 4/2010  |
| WO | 2010101933 A1 | 9/2010  |

OTHER PUBLICATIONS

Axnas, J. et al. "Successive Interference Cancellation Techniques for LTE Downlink." Proceedings of PIMRC 2011, Toronto, Canada, 2011.
Berrou, C. et al. "Near Shannon Limit Error—Correcting Coding and Decoding: Turbo-Codes (1 )." IEEE International Conference on Communications, Geneva, Switzerland, May 23-26, 1993.

(Continued)

*Primary Examiner* — Phung M Chung
(74) *Attorney, Agent, or Firm* — Murphy, Bilak & Homiller, PLLC (57) ABSTRACT

In one or more aspects, the present invention improves the efficiency of soft information transfer within a soft-value processing apparatus, by reducing in some sense the "amount" of soft information transferred between constituent processor circuits within the apparatus, without forfeiting or otherwise compromising the transfer of "valuable" soft information. In one example, the soft values produced by a constituent processor circuit are identified as being reliable or unreliable according to a reliability threshold. Some or all of the unreliable values are omitted from a soft value information transfer to another constituent processor circuit, or they are quantized for such transfer. The reduction in memory requirements for soft information transfer advantageously allows the use of lower power, less complex, and less expensive circuitry than would otherwise be required in the apparatus, which may be, as a non-limiting example, a Turbo receiver in a wireless communication device.

24 Claims, 6 Drawing Sheets

(56) References Cited

OTHER PUBLICATIONS

Douillard, C. et al. "Iterative Correction of Intersymbol Interference: Turbo-Equalization." Transactions on Emerging Telecommunications Technologies, vol. 6, Issue 5, Sep./Oct. 1995.

Cheng, et al. "Bit-Interleaved Turbo-Coded Noncoherent Orthogonal Modulation with Iterative Demodulation and Decoding: Capacity Limits and Convergence Analysis," Conference Record of the 38th Asilomar Conference on Signals, Systems and Computers. Nov. 7, 2004. pp. 1-5. vol. 2. Pacific Grove, CA.

\* cited by examiner

METHOD AND APPARATUS FOR SOFT INFORMATION TRANSFER BETWEEN CONSTITUENT PROCESSOR CIRCUITS IN A SOFT-VALUE PROCESSING APPARATUS

TECHNICAL FIELD

The present invention generally relates to soft information processing and particularly relates to the transfer of soft information within a soft-value processing apparatus.

BACKGROUND

Soft information finds use in a variety of "belief propagation" systems, such as in communications signal decoding where, as a simple example, a series of soft decisions indicate whether corresponding bits in a received communication signal are more likely 1s or 0s. "Turbo" type receivers are a particularly well-known and useful example of soft information processing. Numerous technical references are available regarding the fundamental aspects of Turbo coding and decoding. See, for example, C. Berrou, A. Glavieux, et al., "Near Shannon limit error-correcting coding and decoding: Turbo-codes", Proceedings of ICC 1993, Geneva, Switzerland, pp. 1064-1070; and C. Douillard, A. Picart, P. Didier, M. Jézéquel, C. Berrou, and A. Glavieux, "Iterative correction of intersymbol interference: turbo-equalization", European Transactions on Telecommunications, Vol. 6, No. 5, September-October 1995, pp. 507-512.

During the last two decades, the Turbo principle has been used in constructing a myriad of channel coding schemes, as well as iterative receiver approaches for applications beyond channel coding. However, in a basic Turbo decoding approach, the target receiver implements an iterative decoding structure in which two relatively simple constituent decoders exchange soft information, so that the probability estimates ("beliefs") from one decoder aid the other decoder in refining its estimates. The iterative exchange of probability values—such as Log Likelihood Ratios or LLRs—allows Turbo-based coding and decoding schemes to achieve near Shannon limit performance, despite the use of relatively simple constituent codes.

In more detail, all Turbo receiver algorithms are based on the principle of belief propagation. A number of "decoding" stages provide output soft information about some part of the received signal that is an improved, value-added version of the input soft information, accounting for the local "constituent code" structure and any extrinsic information available from other decoders in the Turbo structure.

The "constituent code" and the corresponding "decoder" may also refer, for example, to a multipath propagation channel and a corresponding equalizer, or to a multiple-access channel and a corresponding Interference Cancellation ("IC") operation. Various examples of Turbo structures beyond channel coding are the Turbo equalizer, the Turbo-IC with soft TDEC ("Turbo Decoder") for MIMO ("Multiple-Input-Multiple-Output") reception. A typical Turbo-IC receiver employs iterative soft IC methods to treat a mix of signal components and approaches the performance of joint detection/decoding for the relevant signal components.

The belief propagation process is realized by exchanging soft bit information between the constituent decoders, or more generally, between the different parts of the Turbo receiver. The soft information may be in the form of an absolute bit probability that a given bit is 0 or 1, or as extrinsic information, i.e., the "added value" provided by the decoder over the input soft information. The optimal information type to be transferred depends on the insertion point in the receiver structure and other design choices.

The linear bit probabilities or extrinsic values fall in the range [0 . . . 1]. In practical implementations, LLRs are used instead, because of their convenient additive property. The LLR values may assume any real value. Small magnitudes indicate uncertain bits, or little added value from the recent decoding iteration in the case of extrinsic information.

While the advantages of Turbo receivers are well understood as a general proposition, their implementation can be challenging, particularly in high data rate environments. In high-rate systems, large blocks of information bits need to be decoded from a received communication signal at each Transmission Time Interval or "TTI." In Release 10 ("Rel-10") of the Long Term Evolution ("LTE") specifications, as promulgated by the Third Generation Partnership Project ("3GPP"), the peak Downlink ("DL") data rate is up to 3 Gb/s for an 8-layer transmission supported by a category-8 UE ("User Equipment"). For such a top-category UE, even one using a "simple" receiver, the peak data rate implies a large demodulation and Turbo decoding load, including the need for an efficient memory management system to retrieve, transfer, and store a large number of soft values in the Turbo processing chain.

For the scenario above, at each TTI, soft values for 3.6E7 (almost 40 million) coded bits are extracted in the demodulator, transferred to the TDEC, and the soft values for 3E6 information bits are iterated a number of times in the TDEC before delivering them to the higher protocol or network layers. This amount of data and processing imposes a considerable and possibly impractical load on the memory subsystems in a UE. More generally, this degree of loading imposes significant processing power requirements, which are in direct tension with cost, power consumption, and size constraints.

Further exacerbating the design challenges, more advanced UEs may have need for even more elaborate receiver structures. For example, an advanced receiver may perform N iterations of the Turbo-IC loop to detect parallel MIMO streams. In slightly simplified terms, the total memory bandwidth ("BW") required by such an architecture is N times higher than the baseline requirements identified above. In a practical example, the value of N may be four, i.e., N=4, and the processing load/BW multiplier is therefore substantial. These circumstances leave open and unaddressed the challenge of developing suitable, cost-effective circuitry for implementing Turbo receivers and other types of soft-value processing apparatuses.

SUMMARY

In one or more aspects, the present invention improves the efficiency of soft information transfer within a soft-value processing apparatus, by reducing in some sense the "amount" of soft information transferred between constituent processor circuits within the apparatus, without forfeiting or otherwise compromising the transfer of "valuable" soft information. In one example, the soft values produced by a constituent processor circuit are identified as being reliable or unreliable according to a reliability threshold. Some or all of the unreliable values are omitted from a soft information transfer to another constituent processor circuit, or they are quantized for such transfer. The reduction in memory requirements for the soft information transfer advantageously allows the use of lower power, less complex, and less expensive circuitry than would otherwise be required in the apparatus, which may be, as a non-limiting example, a Turbo receiver in a wireless communication device.

In one embodiment disclosed herein, a soft-value processing apparatus comprises first and second constituent processor circuits. The first constituent processor circuit includes a soft information set generation circuit that is configured to generate a soft information set comprising a plurality of soft values indicating the reliability of data detections performed with respect to a set of input data values. The first constituent processor circuit further includes a soft value transfer circuit.

In an example implementation, the soft value transfer circuit is configured to: detect low-reliability soft values among the plurality of soft values in the soft information set according to a defined reliability threshold; obtain a compressed soft information set by compressing the soft information set at least with respect to the low-reliability soft values; and transfer the compressed soft information set from the first constituent processor circuit to the second constituent processor circuit, for use as extrinsic information by the second constituent processor circuit.

In another aspect disclosed herein, a method of transferring soft information between constituent processor circuits in a soft-value processing apparatus "compresses" the soft information transferred from one constituent processor circuit to another. In a non-limiting example, a soft-information set generated by a first constituent processor includes high-reliability and low-reliability soft values and is compressed by omitting or quantizing, with respect to the transfer, some or all of the low-reliability soft values in the set. Such quantizing, if performed, entails reducing the numeric resolution of the values so as to reduce the memory size and/or bandwidth requirements associated with storing or transferring them.

In an example embodiment, such a method includes generating a soft information set comprising a plurality of soft values at a first constituent processor circuit that acts as a soft information source for a second constituent processor circuit. The method further includes detecting low-reliability soft values among the plurality of soft values in the soft information set, according to a defined reliability threshold. The method further includes obtaining a compressed soft information set by compressing the soft information set at least with respect to the low-reliability soft values, and transferring the compressed soft information set from the first constituent processor circuit to the second constituent processor circuit.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
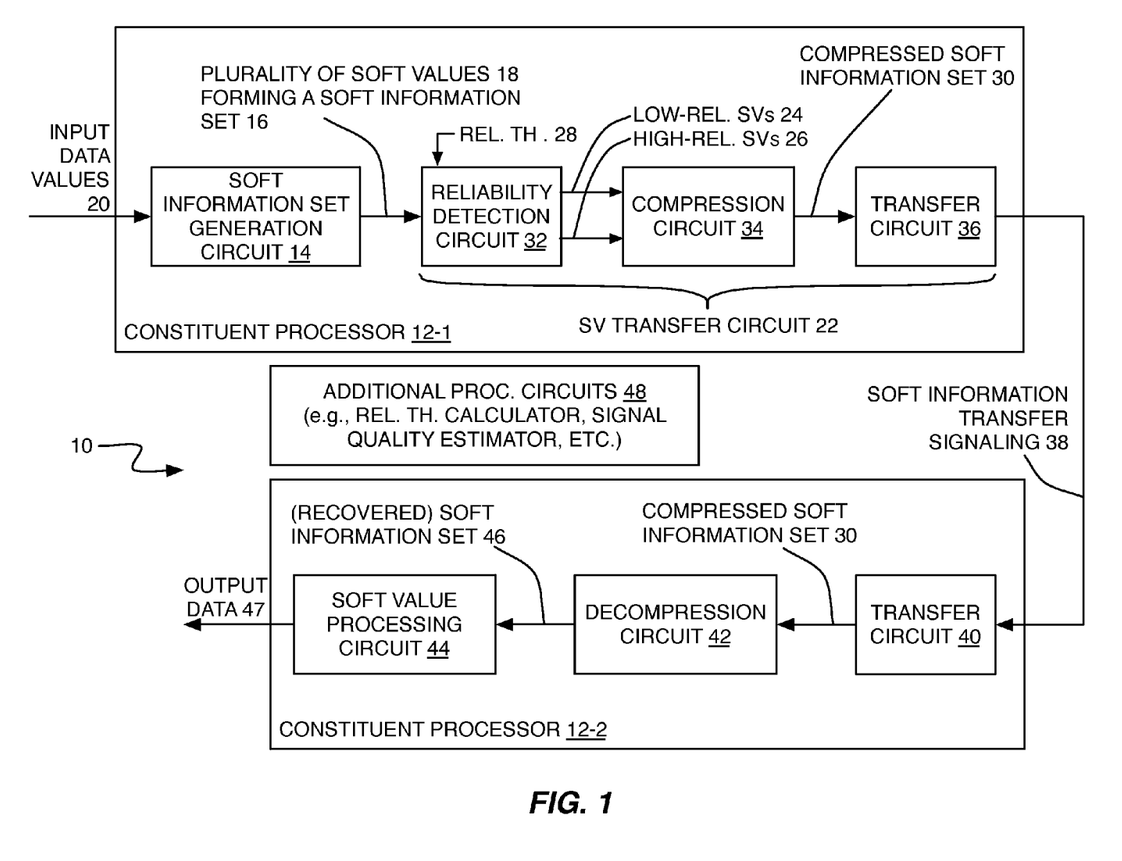
FIG. 1 is a block diagram of one embodiment of a soft-value processing apparatus.

FIG. 1 illustrates a soft-value processing apparatus 10 that includes first and second constituent processor circuits 12-1 and 12-2. The first constituent processor circuit 12-1 includes a soft information set generation circuit 14 configured to generate a soft information set 16 comprising a plurality of soft values 18. The soft values 18 indicate the reliability of data detections performed with respect to a set of input data values 20. As a non-limiting example, the input data values 20 are digital samples representing symbols or bits conveyed in a received communication signal.

In an example case, the soft values 18 are, for example, Log Likelihood Ratios ("LLRs") representing a ratio of the probability that a corresponding received signal bit value is a "1" to the probability that it is a "0." Further, as will be shown, the constituent processor circuits 12 implement one or more Turbo-based processes, such as a demodulator performing bit/symbol detection in a demodulation process, where the demodulator process provides soft values to a decoder process in a feedfoward path and/or where the decoder process provides soft values to the demodulator in a feedback path. Thus, the constituent processors 12-1 and 12-2 are, as non-limiting examples, a demodulation circuit and an associated decoding circuit, or are cooperative pair of decoder circuits.

Turning back to the diagram, the first constituent processor circuit 12-1 further includes a soft value transfer circuit 22—abbreviated as "SV transfer circuit 22" in the diagram—that is configured to detect low-reliability soft values 24 among the plurality of soft values 18 in the soft information set 16 according to a defined reliability threshold 28. Such detection may be performed after generation of the soft information set 16, or on the fly as soft values 18 are being computed.

The soft value transfer circuit 22 is further configured to obtain a compressed soft information set 30 by compressing the soft information set 16 at least with respect to the low-reliability soft values 24. That is, the one or more compression processes applied to the soft information set 16 operate on at least the low-reliability soft values 24. The soft value transfer circuit 22 is further configured to transfer the compressed soft information set 30 from the first constituent processor circuit 12-1 to the second constituent processor circuit 12-2, for use as extrinsic information by the second constituent processor circuit 12-2.

Because of the compression, the overall size or amount of data transferred is reduced and because of the reduction, the memory bandwidth required for the transfer is reduced. In turn, the reduction in memory bandwidth requirements means that lower-speed or simpler, lower-power interconnection circuitry can be used for transferring the compressed soft information set 30, as compared to what would be needed for transferring the (uncompressed) soft information set 16 in the same time interval.

The process of soft information transfer may comprise numerous different operations with digital samples representing the soft information, but typically one or more of the following operations is present and benefits from the reduced memory requirements: buffering the compressed soft information set 30 output by the constituent processor circuit 12-1; transferring the compressed soft information set 30 via a memory or data bus from the constituent processor circuit 12-1 to an intermediate buffer (or common memory); transferring the compressed soft information set 30 via a bus from the intermediate buffer to the second constituent processor circuit 12-2; and buffering the compressed soft information set at the input of the second constituent processor circuit 12-2.

Thus, it may be appreciated that the compression provides benefits both in terms of the capacities (e.g. the supported maximal data transfer rate) of one or more memory or data buses and the memory size requirements of one or more memory blocks in the apparatus 10. Furthermore, the reduced transfer rate due to compression is advantageous by simplifying timing, scheduling, and multiple-access procedures in the memory sub-system hardware and software in the apparatus 10.

As for implementing the compression, in one embodiment of the apparatus 10 the soft value transfer circuit 22 includes a reliability detection circuit 32 that is configured to identify the low-reliability soft values 24 among the soft values 18 in the soft information set 16. The soft value transfer circuit 22 further includes a compression circuit 34 that is configured to compress the soft information set 16 by operating on at least the low-reliability soft values 24 and thereby obtain the compressed soft information set 30. Additionally, the soft value transfer circuit 22 includes a transfer circuit 36 that outputs soft information transfer signaling 38 to the second constituent processor circuit (12-2), wherein the soft information transfer signaling 38 conveys or otherwise indicates the compressed soft information set 30 to the second constituent processor circuit 12-2.

As a non-limiting example, the soft information transfer signaling 38 comprises the compressed soft information set 30, along with additional signaling that indicates the compression operations or protocol applied, so that the second constituent processor circuit 12-2 can determine the ordering or received-data correspondence of the individual values in the soft information 30. For example, the additional signaling indicates the compression operations performed by the first constituent processor circuit 12-1, to enable correct parsing of the compressed soft information set 30 by the second constituent processor circuit 12-2.

For processing and using the compressed soft information set 30, the second constituent processor circuit 12-2 in at least one embodiment comprises a transfer circuit 40, a decompression circuit 42, and a soft value processing circuit 44. Note that the overall apparatus 10 may further include one or more additional processing circuits 48, such as a (soft value) reliability threshold calculator for determining the reliability threshold 28, and a received signal quality estimator for measuring or estimating received signal quality, which may be used to dynamically adjust the reliability threshold 28 in at least one embodiment.

The transfer circuit 40 is configured to receive the soft information transfer signaling 38 from the first constituent processor circuit 12-1 and correspondingly provide the compressed soft information set 30 to the decompression circuit 42. In turn, the decompression circuit 42 is communicatively coupled to the soft-value processing circuit 44 and is configured to decompress the compressed soft information set 30, to obtain a recovered soft information set 46 for use in the soft-value processing circuit 44. Note that interleaving and/or rate matching, if performed, may be applied by the decompression circuit 42 as part of forming the recovered soft information set 46, or such processing may be performed by the soft-value processing circuit 44 before using the recovered soft information set 46.

Figure 2:
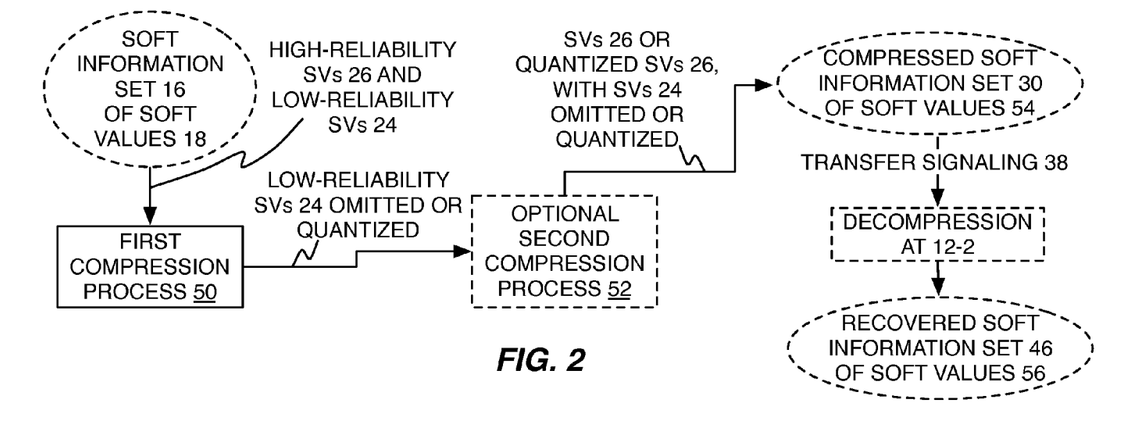
FIG. 2 is a block diagram of example compression processes applied to high-reliability and low-reliability soft values in a soft information set, for compression of that soft information set.

FIG. 2 provides a good working example for one embodiment of the processing used by the soft value transfer circuit 22 in the first constituent processor 12-1 for compressed soft information transfer, and the corresponding soft information recovery at the second constituent processor 12-2. A first compression process 50 implemented by the soft value transfer circuit 22 omits or quantizes the low-reliability soft values 24 identified from the soft values 18 comprising the soft information set 16. As a result of this processing, the memory requirements associated with transferring soft information are reduced, because the transferred soft information at this point would comprise the high-reliability soft values 26 with the low-reliability soft values 24 omitted or quantized, e.g., to a lower bit resolution.

Optionally, however, further reductions in memory requirements associated with the transfer are obtained by applying a second compression process 52 to the high-reliability soft values 26, but not to the extent that valuable information is lost from the perspective of providing soft value information to the second constituent processor circuit 12-2—where the exchanged soft value information represents extrinsic information (the "added value" provided by the latest constituent processing operation), or represents full soft value information. Correspondingly, in at least one embodiment that uses the second compression process 52, the compression applied to high-reliability soft values 26 is less aggressive than any compression applied to the low-resolution soft values 24—e.g., the high-reliability soft values 26 are subjected to less reduction in their resolution in the compression process 52 than are the low-reliability soft values 24 in the compression process 50.

Those skilled in the art will also appreciate that the compression processes 50 and 52 may be performed in parallel, rather than serially, and no limitation to serial processing should be inferred from the diagram. Further, it will be appreciated that the makeup of the compressed soft information set 30 will vary depending on whether the low-reliability soft values 24 are quantized or omitted, and whether the high-reliability soft values 26 are included in the compressed soft information set 30 at full resolution or in quantized form. To broadly denote all such possibilities, the compressed soft information set 30 is shown in FIG. 2 as comprising soft values 54.

The soft values 54 may be: (Case 1) only the high-reliability soft values 26; (Case 2) the high-reliability soft values 26 plus quantized versions of one or more of the low-reliability soft values 24; (Case 3) only quantized versions of the high-reliability soft values 26; or (Case 4) quantized versions of the high-reliability soft values 26 with quantized versions of one or more of the low-reliability soft values 24. Correspondingly, FIG. 2 depicts the decompression process at the second constituent processor circuit 12-2 as producing the aforementioned recovered soft information set 46, comprising recovered soft values 56. With references to these cases, any "quantized" versions of the low-reliability soft values 24 and/or the high-reliability soft values 26 may be understood as being quantized with respect to the respective starting resolutions of the low-reliability soft values 24 or high-reliability soft values 26. Thus, these quantized versions also may be regarded as reduced-resolution or compacted values.

For the Case 1 scenario above, the recovered soft values 56 include the (full-resolution) high-reliability soft values 26 that were included in the compressed soft information set 30, and further include substituted or regenerated values in place of the omitted low-reliability soft values 24. These substituted or regenerated values are "neutral" from a probability weighting perspective, e.g., zero-valued LLR values. For the Case 2 scenario, the recovered soft values 56 include the high-reliability soft values 26 included in the compressed soft information set 30, along with the reduced-resolution versions of the one or more low-reliability soft values 24 that were also included in the compressed soft information set 30. To the extent that any of the low-reliability soft values 24 were omitted rather than quantized, the recovered soft values 56 may include substituted or regenerated values for them. For the Case 3 scenario, the recovered soft values 56 include the quantized versions of the high-reliability soft values 26 included in the compressed information set 30, along with any substituted or regenerated values needed to account for the omitted low-reliability soft values 24. Finally, for the Case 4 scenario, the recovered soft values 56 include the quantized versions of the high-reliability soft values 26 and low-reliability soft values 24 included in the compressed information set 30, along with any substituted or regenerated values needed to account for any omitted ones of the low-reliability soft values 24.

Also, to the extent that interleaving and/or rate matching is needed, such processing may be performed by the decompression circuit 42 when forming the recovered soft information set 46, e.g., as a last step after parsing and processing the compressed soft information set 30 to correctly extract its included soft values 54. Alternatively, the soft-value processing circuit 44 applies interleaving and/or rate matching to the recovered soft information set 46 before using it, e.g., as extrinsic information to improve the generation of output data 47. In any case, it will be understood that the recovered soft information set 46 has a direct correspondence with the soft information set 16 in the first constituent processor circuit 12-1, even where its included soft values 56 are lower-resolution versions of corresponding soft values 18 in the soft information set 16 and/or where they are regenerated or inserted soft values (e.g., neutral or zero values) in place of any soft values 18 that were omitted from the compressed soft information set 30.

For example, the number of soft values 56 included in the recovered soft information set 46 equals the number of soft values 18 in the soft information set 16. More broadly, the population size and ordering of the of the recovered soft information set 46 "matches" or is otherwise compatible with what would have been used at the second constituent processor circuit 12-2 had compressed transfer not been used. Consequently, the use of compressed transfers can be made transparent to the actual soft-value processing, e.g., Turbo processing, in the second constituent processor circuit 12-2.

Further with regard to this example embodiment, but not necessarily other embodiments described herein, those of ordinary skill in the art will appreciate that unlike conventional Turbo processing, interleaving and/or rate-matching coding are not applied to the compressed soft information set 30 at the first constituent processor circuit 12-1, nor as part of the transfer to the second constituent processor circuit 12-2. Instead, to the extent that such operations are used to break apart or randomize block errors in received data that affect the soft values 54 in the compressed soft information set 30, they are applied at the second constituent processor circuit 12-2.

Shifting the interleaving/rate-matching operations to the second constituent processor circuit 12-2 offers certain advantages, at least in some embodiments. For example, in at least one embodiment, the compression algorithm(s) used by the first constituent processor circuit 12-1 recognize the occurrence of low-reliability blocks within the soft information set 16, and achieve a high level of compression via block coding of one or more such blocks. Thus, in at least one embodiment, the soft value transfer circuit 22 is configured to compress the soft information set 16 based on being configured to detect blocks (contiguous sequences) of low-reliability soft values 24 in the soft information set 16 and omit or quantize one or more of the blocks with respect to the compressed soft information set 30. However, this approach requires, or at least favors, deferring interleaving until after decompression at the second constituent processor circuit 12-2, so that compressed blocks are not shuffled or rearranged in the transfer, or, equivalently, so that the soft information transfer signaling 38 is not complicated by having to keep track of interleaving operations.

In any case, the compression processing used by the first constituent processor circuit 12-1 reduces the memory requirement needed for transferring soft information to the second constituent processor circuit 12-2. Here, the "memory requirement" may be one of size, e.g., the required memory for storage, or may be one of bandwidth, e.g., the required transfer rate to provide the compressed soft information set 30 to another Turbo process. To the extent that the particular compression protocol used needs to be signaled as part of the soft information transfer, the soft information transfer signaling 38 from the transfer circuit 36 shown in FIG. 1 can be understood as conveying the compressed soft information set 30 along with any signaling (e.g., flags or other compression-related indicators) needed for processing of the compressed soft information set 30 by the second constituent processor circuit 12-2. In that regard, the decompression circuit 42 of the second constituent processor circuit 12-2 decompresses the compressed soft information set 30 to obtain the recovered soft information set 46 according to the flags, indicators, or other control information embedded in the soft information transfer signaling 38.

Figure 3:
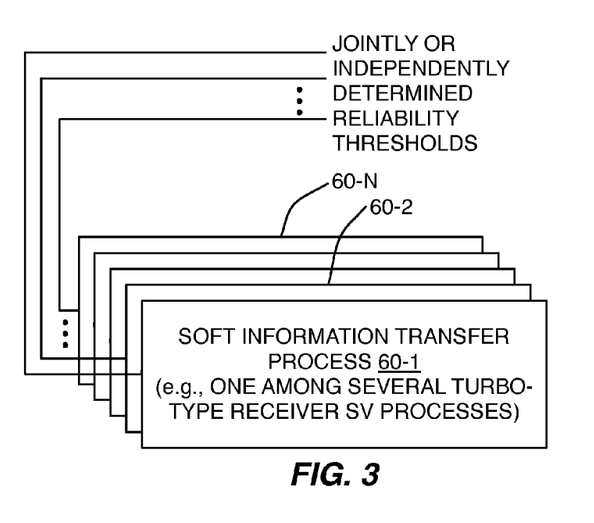
FIG. 3 is a block diagram of one embodiment of parallel soft-value processes implemented in a soft-value processing apparatus.

Turning to FIG. 3, in one or more embodiments, the first constituent processor circuit 12-1 implements one soft information process 60-1 among a number of parallel soft information processes 60 implemented by the soft-value processing apparatus 10. One non-limiting example of a receiver employing parallel soft information processes is a Turbo receiver in a parallel IC configuration, where each parallel branch represents a separately channel-coded component in the received signal. In such a receiver, the soft value quality and the soft information content to be transferred is different for different branches at certain Turbo receiver iterations.

In at least one such embodiment, the soft-value processing apparatus 10 is configured to determine the defined reliability threshold 28 jointly for transferring soft information among the parallel soft information processes 60. In the example receiver above, the joint determination of the threshold 28 comprises finding a threshold that maximizes the total information content transferred over all branches given an overall transfer capacity constraint—in a branch with higher soft value quality, fewer soft values are deemed low-quality, while in a branch with low soft value quality, a larger number of low-quality soft values are removed or otherwise compressed.

Alternatively, the soft-value processing apparatus 10 is configured to determine the defined reliability threshold 28 independently for transferring soft information to or from each of the parallel soft information processes 60. In the example receiver above, this approach would correspond to each branch being allocated a fixed fraction of the total transfer capacity, whereby the threshold is determined based on the given branch's signal quality only. Further, whether the soft-value processing apparatus 10 implements one process or multiple processes, and whether or not it uses joint or independent determination of the defined reliability threshold 28, the threshold itself may be statically or dynamically determined, and thus may be adapted or otherwise adjusted on the fly, as part of ongoing processing.

Figure 4:
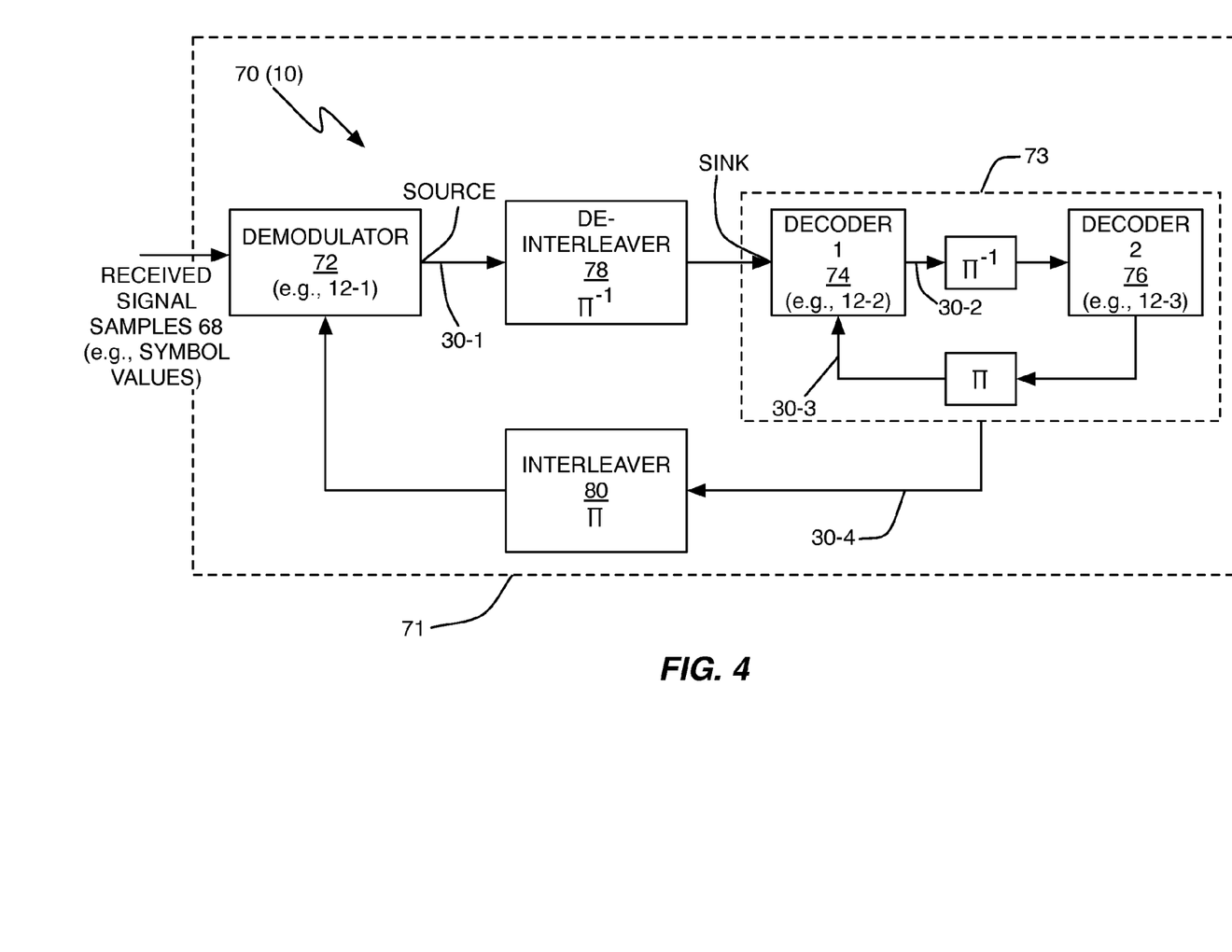
FIG. 4 is a block diagram of a Turbo-type receiver implementation in an embodiment of a soft-value processing apparatus, e.g., where the soft-value processing apparatus of FIG. 1 comprises a Turbo-type receiver for use in a wireless communication device.

In an example context for dynamic computation, FIG. 4 illustrates an advantageous but non-limiting case where the soft-value processing apparatus 10 comprises a Turbo-type receiver 70, as may be included in a wireless communication device 71. The wireless communication device 71 is only partially illustrated, to retain emphasis on the Turbo processing aspects, but it will be understood as including other circuits or elements in dependence on its features, type, and intended use. For example, the wireless communication device 71 comprises a cellular communication transceiver, such as a feature phone, smart phone, network adaptor, embedded modem (e.g., in a Machine-to-Machine application), USB dongle, etc. Of course, these examples are not limiting, and the Turbo-type receiver 70 and, more broadly, the soft-value processing apparatus 10, may be advantageously implemented in a wide variety of devices and systems having need of Turbo processing.

In the illustrated example, the soft values 18 are associated with a received communication signal 68 and the soft-value processing apparatus 10—in its Turbo-receiver implementation—is configured to determine the defined reliability threshold 28 dynamically as a function of a received signal quality measure associated with the received communication signal 68. Such quality measures may be a Received Signal Strength Indicator (RSSI), or a signal-to-noise ratio (SIR), a signal-to-noise-plus-interference ratio (SINR), a channel quality indicator (CQI) value, mean soft value (LLR) magnitude, etc. Moreover, each Turbo-based process (demodulation, decoding, etc.) may use a separately- or jointly-determined defined threshold value 28, and within each process the threshold may be updated per iteration and/or in response to other ongoing changes.

In embodiments where the soft values 18 comprise Log Likelihood Ratios (LLRs), the defined reliability threshold 28 is a magnitude threshold. Accordingly, in one example, soft values 18 that meet or exceed the magnitude threshold are considered to be high-reliability soft values 26, while those below the magnitude threshold are considered to be low-reliability soft values 24.

Turning back to the diagram of FIG. 4, the Turbo-receiver 70 includes a demodulator 72, which can be understood as representing an example of the earlier-described first constituent processor circuit 12-1. Thus, the demodulator 72 acts a source of soft information for an iterative decoder 73 that includes first and second decoder circuits 74 and 76. One also sees in this embodiment, the use of a deinterleaver 78 between the demodulator 72 and the iterative decoder 73. Note that this interposition of the deinterleaver 78 is not optimal for all embodiments of the present invention, and in some cases it is more desirable perform such operations after the soft information sink parses or otherwise interprets the compressed soft information 30 transferred from the corresponding soft information source. In any case, because the decoder circuit 74 acts as a sink for the compressed soft information set 30-1 produced by the demodulator 72, it can be understood as an example of the earlier-described second constituent decoder 12-2.

However, the diagram simultaneously also demonstrates the applicability of the invention within the iterative decoder 73. In accordance with the back-and-forth, iterative nature of decoding implemented between the decoder circuits 74 and 76, each acts with respect to the other one alternately as a source of soft information (function of 12-1) and a sink for soft information (function of 12-2). For example, in one half-iteration of decoding by the decoder circuit 74, a compressed soft information set 30-2 is output for transfer to the decoder circuit 76, where it is used as extrinsic information for improving decoding reliability. Note the presence of additional soft information source/sinks and additional compressed soft information sets, e.g., 12-3 and 30-3, respectively. Further, in a feedback loop, soft information set(s) 30-4 are output from the iterative decoder 73 and fed back to the demodulator 72 through an interleaver 80. Such information becomes a priori information to the demodulator 72, thereby improving the reliability with which it detects symbols in the received signal 68 at the next iteration.

It will be clear to the skilled person that transferring a compressed soft information set according to the invention is equally applicable in this feedback path. Additionally, it will be understood that, depending on receiver complexity and the particular processing application at hand, there may be multiple soft information transfer processes used, and some or all of them may be configured to use the compressed soft information transfer taught herein.

In general, there may be multiple constituent processor circuits 12 in the soft-value apparatus 10, and multiple flows for soft values—including feedforward and feedback paths—between the various constituent processor circuits 12. Further, it should be appreciated that the constituent processor circuits 12 are not necessarily distinct. For example, trellis-based decoding may be used, e.g., in a Maximum a posteriori ("MAP") probability based decoding process that transfers soft value information between forward and reverse traversals of the decoding trellis. In this regard, at least some of the same physical processing circuitry may be reused for performing the signal processing in forward and reverse directions. Logically, the forward processing configuration may be regarded as being a first constituent processor circuit 12-1 and the reverse processing configuration may be regarded as being a second constituent processor circuit 12-2, or vice versa.

Figure 5:
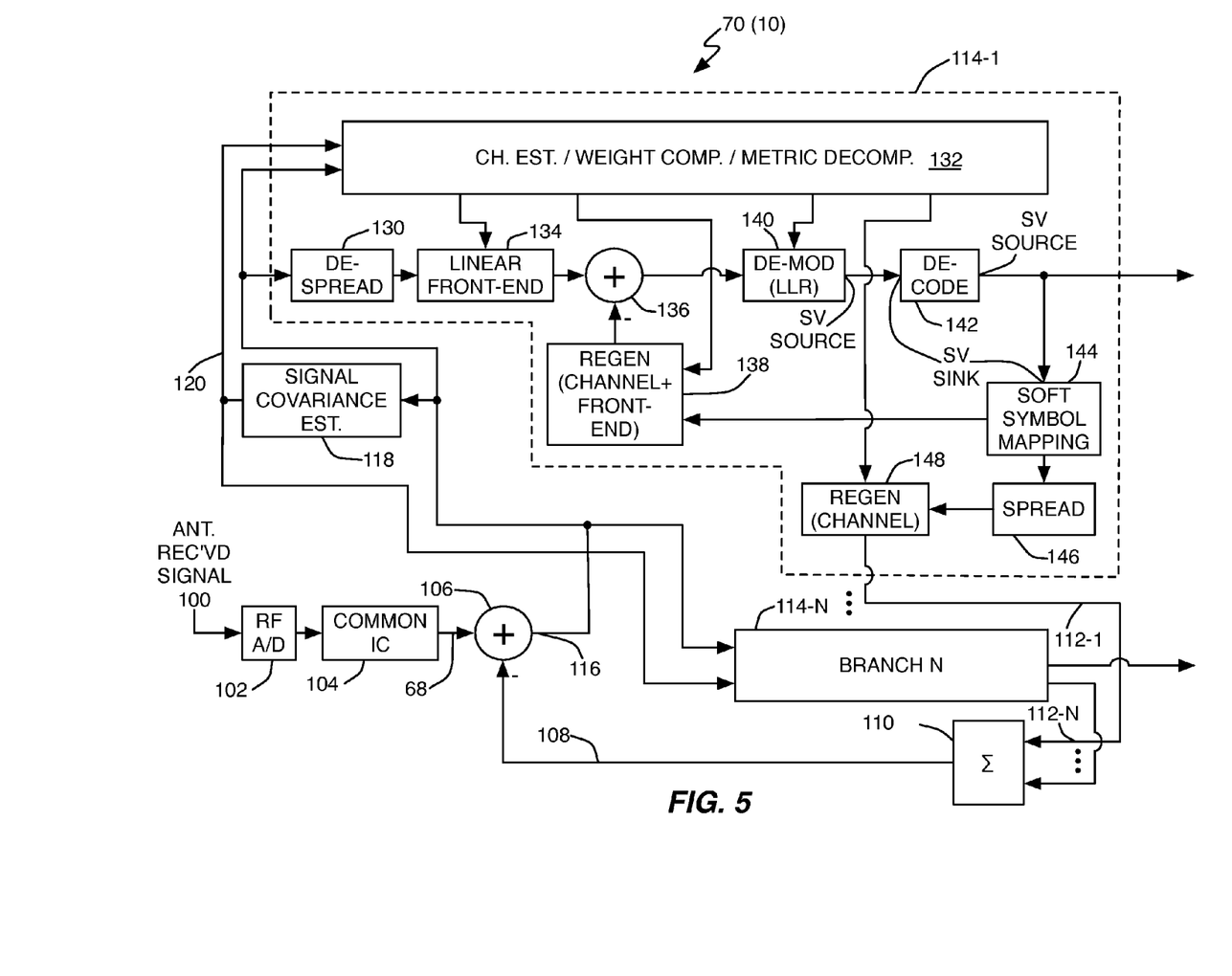
FIG. 5 is a block diagram of another embodiment of a Turbo-type receiver implementation.

FIG. 5 illustrates a more complex embodiment of the Turbo-receiver 70, which nonetheless remains as an advantageous but non-limiting example of the soft-value processing apparatus 10 at issue in this disclosure. An antenna-received signal 100—which itself may be a composite of multiple desired and interfering signal streams—is converted to one or more digital sample streams by an RF circuit and an A/D converter 102 and common Interference Cancellation (IC) is applied to obtain a version of the received signal 68 introduced in FIG. 4.

The received signal 68 is combined in a combining circuit 106 with a cancellation signal 108, that is produced by a combining circuit 110 that combines regenerated signals 112-1 through 112-N that are output from respective ones of the receiver branches 114-1 through 114-N. The combining circuit 106 combines (e.g., subtracts) the cancellation signal 108 from the received signal 68, to obtain a signal 116 that is input to the receiver branches 114, and also to a signal covariance estimation circuit 118, which turn produces covariance estimates 120 that are also provided to the receiver branches 114.

In the non-limiting DS-CDMA receiver example implementation depicted in the diagram of FIG. 5, each receiver branch 114 includes a despreader circuit 130, a channel estimation and combining weight/metric computation circuit 132, a linear front-end circuit 134, a combining circuit 136, a signal regeneration circuit 138, a demodulator circuit 140 (e.g., an LLR-based demodulator), a decoder circuit 142, a soft symbol mapping circuit 144, a spreading circuit 146, and a second signal regeneration circuit 148, which produces the branch output signal 112. The listed circuits form one of several possible Turbo-IC receiver configurations whose functioning can be appreciated by those skilled in the art. The teachings of the invention may be applied to soft information transfer between blocks 140-142 and 142-144.

Figure 6:
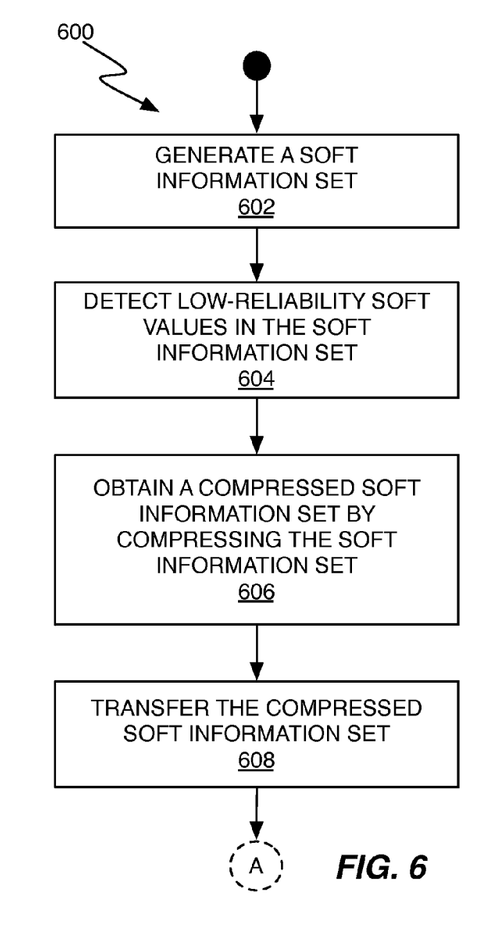
FIG. 6 is a logic flow diagram of one embodiment of a method implemented by the soft-value processing apparatus of FIG. 1, for example, for reducing the memory requirements needed for transferring soft information from one constituent processor circuit to another.

Regardless of the implementation particulars used for realizing the soft-value processing apparatus, it will be appreciated by those skilled in the art that a general aspect of the present invention is improved efficiency in the transfer of soft information—e.g., sets of LLRs or other probability-based values—between processing circuits that use belief propagation for improved performance. For example, FIG. 6 illustrates a processing method 600, for transferring soft information between constituent processor circuits 12-1 and 12-2 in a soft-value processing apparatus 10.

The illustrated method 600 includes generating a soft information set 16 comprising a plurality of soft values 18 at a first constituent processor circuit 12-1 that acts as a soft information source for a second constituent processor circuit 12-2 (Block 602). The method 600 further includes detecting low-reliability soft values 24 among the plurality of soft values 18 in the soft information set 16, according to a defined reliability threshold 28 (Block 604). Further, the method 600 includes obtaining a compressed soft information set 30 by compressing the soft information set 16 at least with respect to the low-reliability soft values 24 (Block 606), and transferring the compressed soft information set 30 from the first constituent processor circuit 12-1 to the second constituent processor circuit 12-2 (Block 608).

Those of ordinary skill in the art will appreciate that one or more of the processing operations illustrated in the method 600 may be performed in a different order, or in parallel, and will also appreciate that the method 600 may be repeatedly executed over successive intervals of time, e.g., on an ongoing basis as part of received signal processing operations. Moreover, the method 600 may in whole or in part be integrated with other processing operations being carried out by the soft-value processing apparatus 10. For example, in the Turbo-receiver implementation, the method 600 may be integrated into an overall received signal processing chain and carried out on a TTI or other recurring time interval basis.

Finally, it will be appreciated that the method 600 may be implemented by dedicated electronic circuits comprising fixed hardware, or may be implemented in whole or in part using one or more microprocessors, DSPs, or other programmable digital processing circuitry that is specially configured or adapted to perform the method 600 based on the execution of stored computer program instructions and any supporting configuration data. As such, and with reference to the example of FIG. 7, in at least one embodiment, the soft-value processing apparatus 10 comprises at least one microprocessor or other digital processing circuitry 200—e.g., the first and second constituent processors 12-1 and 12-2 comprise microprocessor-based circuits—and supporting program and data memory 202 and 204, respectively. Of course, the memory 202 and/or 204 may be integrated with the microprocessor-based circuit(s) 200.

Figure 7:
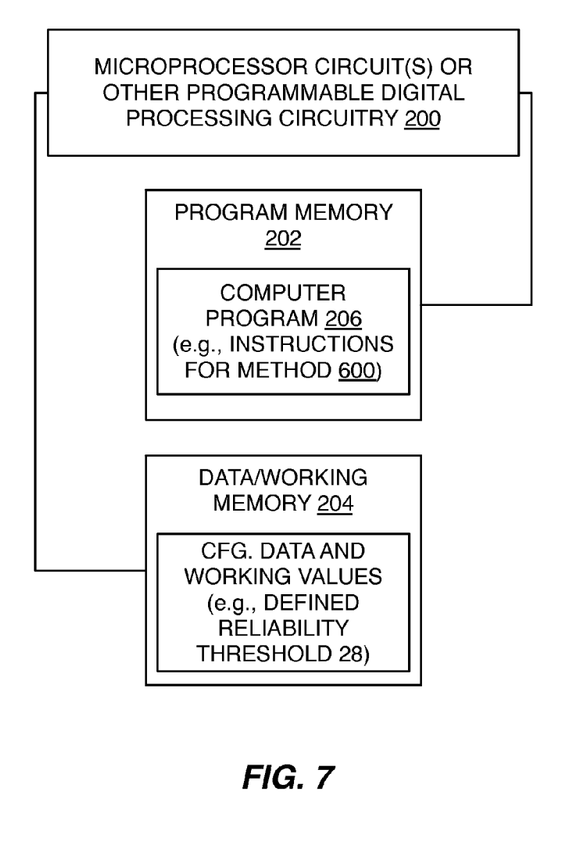
FIG. 7 is a block diagram of one embodiment of a computer-based implementation of a soft-value processing apparatus.

The program memory 202 comprises, for example, FLASH or EEPROM circuitry or other non-volatile computer-computer readable medium storing a computer program 206 comprising program instructions. When executed by the microprocessor-based circuit(s) 200, the computer program 206 configures such circuitry to perform the method 600, or variations thereof. In particular, such circuitry is configured to reduce the memory requirements of soft information transfer between two or more constituent processor circuits 12 in a soft-value processing apparatus 10, based on compressing one or more soft information sets 16 for transfer between constituent processor circuits 12 as compressed soft information sets 30.

Figure 8:
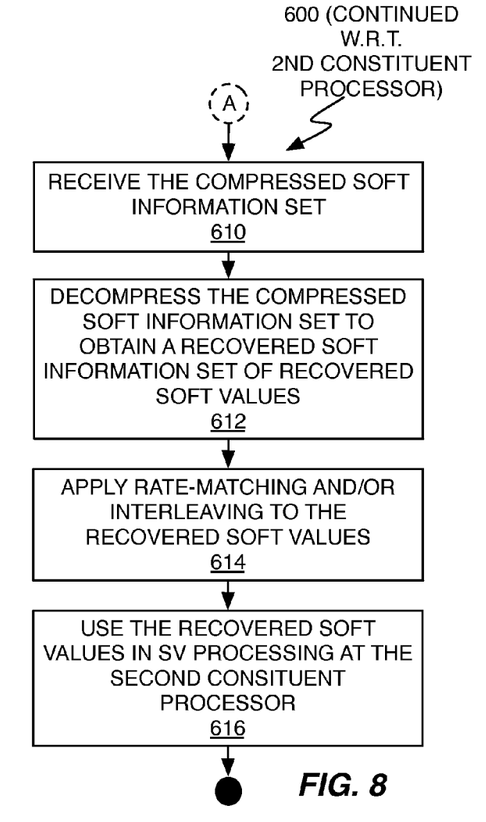
FIG. 8 is a logic flow diagram illustrating additional or extended processing associated with the soft information transfer method at issue in FIG. 6.

The preceding details highlighted a number of example approaches to compression—e.g., quantizing some or all of the low-reliability soft values 24 in a soft information set 16, or outright omitting some or all such values. These operations represent a special form of "source encoding" for more efficient soft information transfer from a first constituent processor circuit 12-1 that is acting as a source of soft information for a second constituent processor circuit 12-2. FIG. 8 illustrates that another aspect or extension of the method 600 therefore involves the second constituent processor circuit 12-2 and the operations performed by it with respect to its reception of a compressed soft information set 30 from the first constituent processor circuit 12-1.

According to the example of FIG. 8, from the complementary perspective of the second constituent processor circuit 12-2, the method 600 further includes receiving a compressed soft information set 30 from a first constituent processor circuit 12-1 (Block 610). This aspect of the method 600 further includes extracting the soft values 54 included in the compressed information set 30 (Block 612) as part of forming the recovered soft information set 46 of recovered soft values 56, and applying one or both of interleaving and rate-matching to the recovered soft values 56 for use by the second constituent processor circuit 12-2 (Blocks 614 and 616). Again, such use generally is as extrinsic information to improve soft-detection computations being carried out by the second constituent processor circuit 12-2, and interleaving and rate-matching are performed as needed and in dependence on the nature of the underlying data being processed, as those of ordinary skill in the art will understand.

Indeed, in one or more embodiments contemplated herein, interleaving and/or rate matching occurs in the compressed soft information signal flow, e.g., between the output of soft information source and the input of the soft information sink. Such an approach is used, for example, in cases where the omission of low-reliability soft values 24 is signaled on an individual basis. On the other hand, in embodiments that take advantage of block compression, it may be more desirable and less complex to pass the compressed soft information set 30 (via signaling 38) from the source to the sink cleanly, and then perform interleaving and/or rate matching at the sink after de-compression of the compressed soft information set 30.

Figure 9:
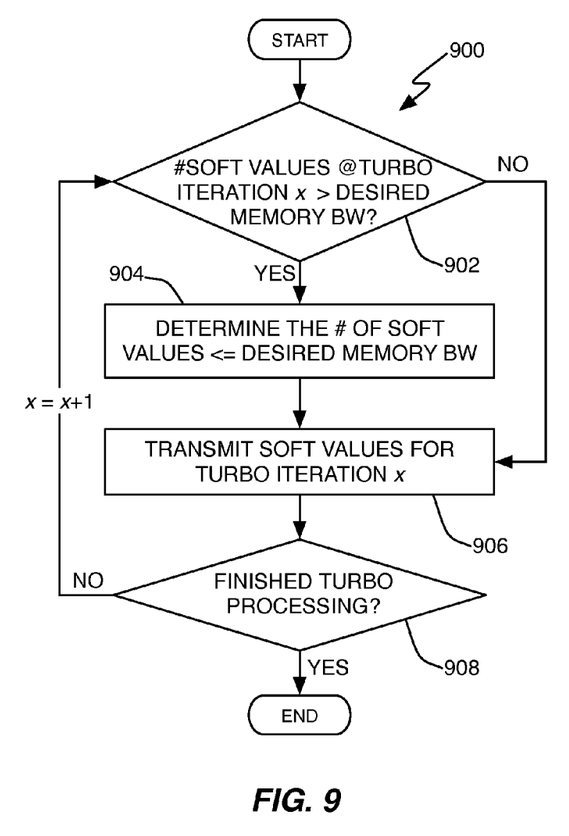
FIG. 9 is a logic flow diagram illustrating an extension or variation of the soft information transfer method at issue in FIG. 6.

FIG. 9 illustrates yet another extension or variation of the method 600. The illustrated method 900 is implemented by the soft-value processing apparatus 10 and represents an example approach to coordinating iterative soft-value generation, transfer, and processing involving two or more constituent processors 12 within the soft-value processing apparatus 10.

The diagram context relates to the "x-th" and "x-th+1" iterations of a soft information process 60. In a first operation, the method 900 determines whether the number ("#") of soft values 18 to be transferred in the x-th iteration from one constituent processor circuit 12 to another constituent processor circuit 12 exceeds a desired memory bandwidth. Here, "desired" may mean an actual cap or limit on memory bandwidth—where such bandwidth may be measured in bits-per-second or some equivalent metric. However, "desired" memory bandwidth also may mean a statically or dynamically allocated portion of overall data transfer capabilities, where it is desired that the amount of bandwidth needed for transfer between respective constituent processor circuits 12 be limited to preserve bandwidth for other soft information processes 60 that also require respective portions of the available memory bandwidth.

If the number of soft values 18 in the corresponding (uncompressed) soft information set 16 is such that the desired memory bandwidth will not be exceeded, the soft information set 16 can be transferred as is. That is, it is not necessary to form a compressed soft information set 30 corresponding to the soft information set 16. Such can be signaled to the receiving constituent processor circuit 12, or it may be that the receiving constituent processor circuit 12 recognizes the incoming soft information as being uncompressed unless the soft information transfer signaling 38 shown in FIG. 1 indicates that the soft information being transferred is in the form of a compressed soft information set 30. Such signaling can be quite simple, e.g., single-bit flags, or other low overhead indicators carried in the information stream comprising the soft information transfer signaling 38. Such signaling also may be implicit, e.g., where the absence of a flag or other indicator is understood by the receiving constituent processor circuit 12 to mean that uncompressed (or compressed) soft information is being transferred.

In the diagram, if the "NO" path is taken from Block 902 (no compression), processing skips to Block 906 where the soft values 18 for Turbo iteration x are transferred without compression. However, if the need for compression is indicated, "YES" from Block 902, processing continues to Block 904, where the extent or degree of compression needed to meet the desired memory bandwidth constraint is determined. This determination may be expressed in terms of the number of soft values that can be transferred in the defined transfer time interval without exceeding the desired memory bandwidth.

That number would then dictate, for example, the minimum number of low-reliability soft values 24 that would need to be omitted from the soft information set 16, in order to meet the memory bandwidth constraint. At least that number is omitted to form the corresponding compressed soft information set 30, wherein the soft values 54 in the compressed information set 30 are the high-reliability values 26 among the plurality of soft values 18 in the corresponding soft information set 16, along with any of the low-reliability soft values 24 that were not omitted. In some sense, an equivalent approach is based on adjusting the threshold 28 up or down, to thereby increase or decrease, respectively, the number of soft values 18 in the soft information set 16 that are considered to be low-reliability soft values 24.

Thus supplied with a compressed soft information set 30, Block 906 transfers the compressed soft information set 30, and processing continues with determination of whether the iteration limit has been reached (Block 908). If iteration x is not the last iteration—determined either by a hard limit in the number of iterations and/or by a quality metric—processing repeats with the next, x+1 iteration.

Those skilled in the art will recognize from the teachings herein that the method 900 can be readily varied. For example, rather than determining the number of soft values that can be transferred within the desired memory bandwidth constraint, as is done in Block 904, such processing can be carried out by setting a limit for the size or amount of data to be transferred, measured in terms of bits, bytes, words, or some other unit of memory allocation. In this approach, then, the soft-value processing apparatus 10 computes the reduction in memory amount needed to meet the desired limit. That calculation in turn controls whether or how many of the low-reliability soft values 24 are omitted, or how aggressively the soft-value processing apparatus quantizes the low-reliability soft values 24 in the soft information set.

With all such variations and possibilities in mind, it may be helpful to elaborate a specific example. Consider the task of transferring a block of K soft values 18, $b=\{b\_i\}$ from a source constituent processor circuit 12 to a sink constituent processor circuit 12 in a Turbo receiver architecture. The source may be a single-symbol- or joint demodulator output of a soft decoder (e.g. soft-TDEC), etc. The sink may be a soft symbol mapper, input of a decoder (e.g. TDEC), etc. The block of K soft values may be interleaved/de-interleaved or otherwise manipulated at the source or sink side.

Let the numeric threshold for the useful information content be "tau," e.g., the defined reliability threshold 28 is textually denoted as tau. Then, in one embodiment, only bit positions j in b whose soft value magnitude exceeds the threshold are transferred. Let the soft value $b\_j$ be stored with a resolution of M bits. Then the following simple coding scheme may be used:

if $|b\_j|$>tau, transmit $[1 b\_j]$ (M+1 bits), else transmit [0] (1 bit).

The "1" bit transmitted if $|b\_j|$ exceeds tau and the "0" bit transmitted if not can be understood as "signaling" bits used by the receiving constituent processor circuit 12 as part of the soft information transfer signaling 38 shown in FIG. 1. That is, these bit indicators enable correct parsing of the compressed soft information set 30 by the receiving circuit.

According to this example signaling protocol, the "1" flag may be understood as indicating that a soft value immediately follows (e.g., of a known resolution or payload size), while the "0" flag indicates omission of a soft value. In this manner, the receiving constituent processor circuit 12 receives as many flags as there were soft values 18 in the (uncompressed) soft information set 16 that is being represented by the compressed soft information set 30 transferred to it, which includes soft values 54 as shown in FIG. 2. This feature allows the receiving constituent processor circuit 12 to count or otherwise track the number and order of soft values 18 that were in the soft information set 16, so that the soft values 54 extracted from the compressed soft information set 30 can be properly associated with the corresponding data items being processed—e.g., the recovered soft values 56 in the recovered soft information set 46 can be ordered and matched by the receiving constituent processor circuit 12 to the corresponding bits or symbols being decoded from a received communication signal 68.

For the scheme immediately above, it will be appreciated that the "1" flag means that a soft value 54 was included in the compressed soft information set 30 for a respective bit or symbol being decoded and thus can be used as extrinsic information for that bit or symbol. Conversely, a "0" flag means no soft value 54 is included in the compressed soft information set 30 for the corresponding one of the bits or symbols being processed at the receiving constituent processor circuit 12-2. The circuit 12-2 would, as part of forming the recovered soft information set 46, typically replace the missing soft values by values suggesting a lack of information for those positions (soft values equal to zeros if the soft values are LLR values). It is contemplated herein to extend or adapt this signaling protocol to embodiments that use quantization in addition to omission, or as an alternative to omission. For example, "1" flags are paired with uncompressed soft values, while "0" flags are paired with quantized soft values (e.g., where the payload sizes for uncompressed and quantized soft values are known or pre-agreed upon).

In the above example signaling protocol, the compressed soft information set 30 is easily decoded at the receiving constituent processor circuit 12. Notably, improvements in memory bandwidth efficiency are achieved if at least one in M−1 soft values 18 is omitted when forming the compressed soft information set 30.

In another embodiment, to reduce the overhead of signaling omissions, adjacent low-reliability soft values 24 may be identified in the soft information set 16 and excluded from the compressed soft information set 30 as a low-reliability block. It may be advantageous to omit any interleaving/de-interleaving and/or rate-matching at the source constituent processor circuit 12 in this case, as the corresponding adjacent values in the data associated with the block of low-reliability soft values 24 soft values are often correlated (e.g. fast fading effects at the output of the demodulator) and it may be easier to define contiguous low-information bit blocks prior to any manipulation of the output bit stream. The manipulation step—e.g., interleaving—may then be performed at the sink (receiving constituent processor circuit 12) instead.

In yet another embodiment, instead of excluding the low-reliability soft values 24 from the compressed soft information set 30, their resolution may be lowered, preferably in a block arrangement. In further embodiments, additional approaches from the field of source coding may be invoked to achieve even more efficient information compression.

In another class of embodiments, soft value magnitudes that lie above a defined threshold 28 may be manipulated, too. That is, some treatment may be applied to the high-reliability soft values 26 among a plurality of soft values 18 comprising the soft information set 16. For example, let the threshold be set to a value $2^N$ (2 raised to the N-th power), where N<M, i.e., values with a dynamic range of N bits are omitted. Then, memory bandwidth can be reduced even further by altering the simple coding scheme accordingly as, if $|b\_j|$>tau, transmit [1$b\_j$_rescaled]($M\text{-}L$+1 bits),
    else transmit [0] (1 bit), where b_j_rescaled contains the L most significant bits of the original soft value b_j.

In other words, M−L least significant bits of the high-reliability soft values 26 among the soft values 18 in the soft information set 16 may be excluded for forming the corresponding soft values 54 contained in the compressed soft information set 30. Typically, L>=M−N; however, specific choices of L and N allow for numerous performance/complexity trade-offs.

Several approaches are possible for determining the defined reliability threshold 28 on a per-process basis within the soft-value processing apparatus 10—refer back to FIG. 3 for an example of parallel or multiple soft-values processes 60 being carried out within the soft-value processing apparatus 10. As an example, a "soft information process" may connote a particular soft-value processing iteration in an iterative Turbo decoder and/or may connote the soft-value processes carried out by different ones of the entities exchanging soft information—e.g., a demodulator and a decoder each implement a soft information process and exchange their respectively computed soft values as extrinsic information for use by the other.

In one embodiment, the defined reliability threshold 28 may be determined dynamically to minimize the performance impact of soft information omission that is performed as part of compression. For LTE, given that the code blocks in the received communication signal exhibit similar SNR, the soft-value processing apparatus 10 could process a first code block in an optimal way. If the code block passes, it could then reprocess it with a heuristic threshold. If it passes again, then the threshold value was a good choice for use as the defined reliability threshold 28; otherwise it may decrease the threshold by a delta value.

In another embodiment, the defined reliability threshold 28 is determined so as to meet a predetermined memory bandwidth constraint. In general, signal-to-interference-and-noise ratio (SINR) is an indicator for choosing the defined reliability threshold(s) 28 used by the soft-value processing apparatus 10, either on fixed or per-process basis. This example usage of SINR arises from the recognition that SINR directly determines the shape of a histogram of soft values as determined for a received communication signal 68. For each soft-value source—e.g., constituent processor circuit 12—within the soft-value processing apparatus 10, a histogram of soft value magnitude distribution may be constructed in conjunction with the demodulation process. The histogram may not need to have a high resolution; interpolation in the region of interest may be applied to determine the exact value a defined reliability threshold 28. The available memory bandwidth resources, the efficiency of the encoding process, and the original soft value load is known, thus allowing computation of the fraction of soft values that must be omitted. The defined reliability threshold 28 is then chosen so as to result in an exclusion tail in the histogram whose weight equals the desired fraction. Those skilled in the art will appreciate that other quantities that have a deterministic mapping to the SINR, for example, the mean soft value magnitude, may be used as alternative signal quality indicator.

In some receiver structures, e.g., the parallel IC architecture, several soft-value processes need to be carried out in parallel and these parallel processes compete for the same memory bandwidth resources. One example of such processes may be per-cell demodulators transferring soft values to their respective TDECs in a neighbor-cell IC receiver. The soft information contents in the different processes and their sensitivity to information omission may be different, e.g., due to the different effective SINR levels experienced by the different cells' signals. In yet another embodiment, to minimize the total information loss (distortion) due to soft value omission during the transfer, the defined reliability thresholds 28 for transferring soft values among some or all of the parallel processes may be determined jointly. The per-process histograms are used to determine individual thresholds that together lead to the desired total tail weight while minimizing, in some sense, the expected value of the omitted soft values. Also, note that the defined reliability threshold 28 used in any given process may be dynamically adapted on a per-iteration basis. For example, a given constituent processor circuit 12 may scale or otherwise adjust the defined reliability threshold 28 used by it with each iteration of the Turbo process it implements. Such adjustments may be based on iteration count, or based on the evaluation of a quality or other metric associated with the Turbo process.

While the details and refinements immediately above are advantageous at least in certain applications, they are not limiting with respect to the present invention. In a broad aspect, the present provides iterative Turbo receiver architectures for high peak data rates, while reducing the memory bandwidth support requirements of such architectures. The invention offers particular but non-limiting advantages in the implementation of Turbo-IC receivers, because any moderate performance degradation incurred in any given iteration arising from the use of compressed soft information sets (as opposed to uncompressed soft information sets 16) may be recovered in subsequent receiver iterations.

More broadly, with respect to the soft information transfer between Turbo processor circuits, instead of transferring soft information for all (data) bits with a pre-determined resolution, only soft information for the bits with high reliability or high extrinsic information content is transferred. In some embodiments, contiguous blocks of soft values with low information content are identified and excluded from the transfer. In more elaborate embodiments, a quantization resolution may be adaptively adjusted, based on the information content, to conserve memory bandwidth, etc.

In one approach, a defined reliability threshold 28 is applied to the soft values 18 in a soft information set 16 and the soft values 18 with magnitudes above the threshold are transmitted without further manipulation—i.e., the high-reliability soft values 26 are transmitted without further manipulation—while the remaining soft values 18, the low-reliability soft values 244, are "processed" (i.e., omitted, or transmitted with lower resolution, or subjected to other compression/source coding algorithms). However, at least one embodiment herein adds the additional feature that the high-reliability soft values 26 are also manipulated, for formation of the compressed soft information set 30. Manipulation of larger values could entail, e.g., sending the M-L most significant bits only, as described above. The reason for enabling such additional savings in the transfer requirements is that the primary reason for a given fixed bit resolution is to provide a certain dynamic range. Thus, if the soft-value processing apparatus 10 separates the low-reliability soft values 24 and performs separate processing on them, then at least some significant bits of the high-reliability soft values 26 are no longer required in the downwards direction and contribute very little useful additional information.

Therefore, in at least one embodiment, forming the compressed soft information set 30 from the uncompressed soft information set 16 includes: performing a thresholding operation on the on the plurality of soft values 18 comprising the soft information set 16, to identify the low-reliability soft values 24 and the high-reliability soft values 26 among the plurality of soft values 18. Formation continues with processing the high-reliability soft values 26 according to a first approach (e.g., omitting some LSBs or doing nothing), and processing the low-reliability soft values 24 according to a second approach (e.g., omitting them altogether; or omitting some MSBs; or doing something more advanced), and transferring the resultant compressed soft information set from the source to the sink.

The above processing can be understood as a method of soft information transfer between two constituent blocks in an iterative processing unit where less than the full soft value set is transferred and where the omitted soft information is chosen so as to minimize the lost information content. For example, source coding/linear prediction/etc., approaches may be used to identify the soft information to be omitted and/or to compress the information to be transferred.

In an iterative Turbo-IC receiver context, the method may be understood as transferring a block of soft values between a source block and sink block in a Turbo receiver, where one or more soft values at the output of the source are omitted from transfer, and where the soft values to be omitted are those whose magnitude is below a threshold. Contiguous blocks of low-information soft values may be omitted, and interleaving/rate-matching operations may be performed at the sink end of the transfer, instead of as an intermediate step between the transfer from the source block to the sink block. In a parallel IC structure, the reliability threshold for transferring soft information from (or to) each soft information process may be determined independently, or may be determined jointly.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. A method of transferring soft information between constituent processor circuits in a soft-value processing apparatus, the method comprising:
   generating a soft information set comprising a plurality of soft values at a first constituent processor circuit that acts as a soft information source for a second constituent processor circuit;
   detecting low-reliability soft values among the plurality of soft values in the soft information set according to a defined reliability threshold;
   obtaining a compressed soft information set by compressing the soft information set at least with respect to the low-reliability soft values; and
   transferring the compressed soft information set from the first constituent processor circuit to the second constituent processor circuit.

2. The method of claim 1, wherein obtaining the compressed soft information set comprises subjecting the low-reliability soft values to a first process that reduces a memory requirement of the compressed soft information set as compared to the soft information set by performing at least one of: omitting one or more of the low-reliability soft values; and reducing a resolution of one or more of the low-reliability soft values.

3. The method of claim 2, wherein obtaining the compressed soft information set further includes subjecting high-reliability soft values in the soft information set to a second process that reduces a resolution of one or more of the high-reliability soft values.

4. The method of claim 1, wherein obtaining the compressed soft information set comprises omitting or quantizing some or all of the low-reliability soft values.

5. The method of claim 1, wherein obtaining the compressed soft information set further comprises quantizing some or all of the high-reliability soft values.

6. The method of claim 1, wherein transferring the compressed soft information set includes signaling the compression operations performed by the first constituent processor circuit, to enable correct parsing of the compressed soft information set by the second constituent processor circuit.

7. The method of claim 1, wherein compressing the soft information set comprises detecting contiguous blocks of low-reliability soft values in the soft information set and omitting or quantizing one or more of the contiguous blocks with respect to the compressed soft information set.

8. The method of claim 1, further comprising, at the second constituent processor circuit, receiving the compressed soft information set from the first constituent processor circuit, decompressing the compressed soft information set to obtain a recovered soft information set, and applying one or both of interleaving and rate-matching to recovered soft values in the recovered soft information set for use by the second constituent processor circuit.

9. The method of claim 1, wherein the method comprises one in a number of parallel soft information processes, and further includes determining the defined reliability threshold jointly for transferring soft information among the parallel soft information processes.

10. The method of claim 1, wherein the method comprises one in a number of parallel soft information processes, and further includes determining the defined reliability threshold independently for transferring soft information to or from each of the parallel soft information processes.

11. The method of claim 1, wherein the soft-value processing apparatus comprises a turbo receiver and the soft values are associated with a received communication signal, and wherein the method further comprises determining the defined reliability threshold dynamically as a function of a received signal quality measure associated with the received communication signal.

12. A soft-value processing apparatus comprising first and second constituent processor circuits, wherein the first constituent processor circuit comprises:
   a soft information set generation circuit configured to generate a soft information set comprising a plurality of soft values indicating the reliability of data detections performed with respect to a set of input data values; and
   a soft value transfer circuit configured to:
   detect low-reliability soft values among the plurality of soft values in the soft information set according to a defined reliability threshold;
   obtain a compressed soft information set by compressing the soft information set at least with respect to the low-reliability soft values; and
   transfer the compressed soft information set from the first constituent processor circuit to the second constituent processor circuit, for use as extrinsic information by the second constituent processor circuit.

13. The soft-value processing apparatus of claim 12, wherein the soft value transfer circuit comprises a reliability detection circuit that is configured to identify the low-reliability soft values among the soft values in the soft information set, a compression circuit that is configured to compress the soft information set by operating on at least the low-reliability soft values and thereby obtain the compressed soft information set, and a transfer circuit that outputs soft information transfer signaling to the second constituent processor circuit, wherein the soft information transfer signaling indicates the compressed soft information set.

14. The soft-value processing apparatus of claim 12, wherein the soft value transfer circuit is configured to subject the low-reliability soft values to a first process that reduces a memory requirement of the compressed soft information set as compared to the soft information set, based on being configured to omit one or more of the low-reliability soft values, or reduce a resolution of one or more of the low-reliability soft values, or both.

15. The soft-value processing apparatus of claim 14, wherein the soft value transfer circuit is further configured to subject high-reliability soft values among the plurality of soft values in the soft information set to a second process that reduces a resolution of one or more of the high-reliability soft values.

16. The soft-value processing apparatus of claim 12, wherein soft value transfer circuit is configured to obtain the compressed soft information set based on being configured to omit or quantize some or all of the low-reliability soft values.

17. The soft-value processing apparatus of claim 12, wherein the soft value transfer circuit is configured to obtain the compressed soft information set based on being further configured to quantize one or more high-reliability soft values among the plurality of soft values in the soft information set.

18. The soft-value processing apparatus of claim 12, wherein soft value transfer circuit is configured to transfer information, as part of soft information transfer signaling sent from the first constituent processor circuit to the second constituent processor circuit, indicating the compression operations performed by the first constituent processor circuit, to enable correct parsing of the compressed soft information set by the second constituent processor circuit.

19. The soft-value processing apparatus of claim 12, wherein the soft value transfer circuit is configured to compress the soft information set based on being configured to detect contiguous blocks of low-reliability soft values in the soft information set and omit or quantize one or more of the contiguous blocks with respect to the compressed soft information set.

20. The soft-value processing apparatus of claim 12, wherein the second constituent processor circuit comprises a transfer circuit that is configured to receive the compressed soft information set from the first constituent processor circuit, a decompression circuit that is configured to decompress the compressed soft information set to obtain a recovered soft information set of recovered soft values and apply one or both of interleaving and rate-matching to the recovered soft values for use by the second constituent processor circuit.

21. The soft-value processing apparatus of claim 12, wherein the first constituent processor circuit implements one among a number of parallel soft information processes implemented by the soft-value processing apparatus, and wherein the soft-value processing apparatus is configured to determine the defined reliability threshold jointly for transferring soft information among the parallel soft information processes.

22. The soft-value processing apparatus of claim 12, wherein the first constituent processor circuit implements one among a number of parallel soft information processes implemented by the soft-value processing apparatus, and wherein the soft-value processing apparatus is configured to determine the defined reliability threshold independently for transferring information to or from each of the parallel soft information processes.

23. The soft-value processing apparatus of claim 12, wherein the soft-value processing apparatus comprise a turbo-type receiver and the soft values are associated with a received communication signal, and wherein the soft-value processing apparatus is further configured to determine the defined reliability threshold dynamically as a function of a received signal quality measure associated with the received communication signal.

24. A wireless communication device comprising a soft-value processing apparatus, the soft-value processing apparatus comprising first and second constituent processor circuits, wherein the first constituent processor circuit comprises:
   a soft information set generation circuit configured to generate a soft information set comprising a plurality of soft values indicating the reliability of data detections performed with respect to a set of input data values; and a soft value transfer circuit configured to:
detect low-reliability soft values among the plurality of soft values in the soft information set according to a defined reliability threshold;
obtain a compressed soft information set by compressing the soft information set at least with respect to the low-reliability soft values; and
transfer the compressed soft information set from the first constituent processor circuit to the second constituent processor circuit, for use as extrinsic information by the second constituent processor circuit.

\* \* \* \* \*

UNITED STATES PATENT AND TRADEMARK OFFICE
CERTIFICATE OF CORRECTION

| | |
|---|---|
| PATENT NO. | : 8,713,414 B2 |
| APPLICATION NO. | : 13/358978 |
| DATED | : April 29, 2014 |
| INVENTOR(S) | : Kamuf et al. |

It is certified that error appears in the above-identified patent and that said Letters Patent is hereby corrected as shown below:

On the Title Page, item [73] Assignee, please change
"TELEFONAKTIEBOLAGER L M ERICSSON (PUBL), Stockholm (SE)" to
-- TELEFONAKTIEBOLAGET L M ERICSSON (PUBL), Stockholm (SE) --.

Signed and Sealed this
Twenty-ninth Day of July, 2014

Michelle K. Lee
*Deputy Director of the United States Patent and Trademark Office*